United States Patent
Hsiao et al.

(10) Patent No.: US 7,700,991 B2
(45) Date of Patent: Apr. 20, 2010

(54) TWO BIT MEMORY STRUCTURE AND METHOD OF MAKING THE SAME

(75) Inventors: Ching-Nan Hsiao, Kaohsiung County (TW); Ying-Cheng Chuang, Taoyuan County (TW); Chung-Lin Huang, Tao-Yuan (TW); Shih-Yang Chiu, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 109 days.

(21) Appl. No.: 11/946,868

(22) Filed: Nov. 29, 2007

(65) Prior Publication Data

US 2009/0014773 A1    Jan. 15, 2009

(30) Foreign Application Priority Data

Jul. 10, 2007    (TW) ............................... 96125082 A

(51) Int. Cl.
*H01L 29/76* (2006.01)

(52) U.S. Cl. ........................ 257/314; 257/315; 257/316; 438/257

(58) Field of Classification Search ......... 257/314–316, 257/E29.3, E21.54; 438/257
See application file for complete search history.

(56) References Cited

U.S. PATENT DOCUMENTS 6,906,379 B2 *   6/2005   Chen et al. .................. 257/315
6,952,034 B2 *   10/2005  Hu et al. ..................... 257/315

* cited by examiner

*Primary Examiner*—Theresa T Doan
(74) *Attorney, Agent, or Firm*—Winston Hsu

(57) ABSTRACT

A method for fabricating the memory structure includes: providing a substrate having a pad, forming an opening in the pad, forming a first spacer on a sidewall of the opening, filling the opening with a sacrificial layer, removing the first spacer and exposing a portion of the substrate, removing the exposed substrate to define a first trench and a second trench, removing the sacrificial layer to expose a surface of the substrate to function as a channel region, forming a first dielectric layer on a surface of the first trench, a surface of the second trench and a surface of the channel region, filling the first trench and the second trench with a first conductive layer, forming a second dielectric layer on a surface of the first conductive layer and the surface of the channel region, filling the opening with a second conductive layer, and removing the pad.

7 Claims, 12 Drawing Sheets

TWO BIT MEMORY STRUCTURE AND METHOD OF MAKING THE SAME

BACKGROUND OF THE INVENTION

1. Field of the Invention

The present invention relates to a memory structure and a method of making the memory structure, and more particularly, to a memory structure having two gates embedded in the substrate and the method of making the same.

2. Description of the Prior Art

It is well known that memory devices have become essential elements of electronic products. For example, a cell phone, a computer system, and a personal digital assistant (PDA) all comprise memory devices to store data or program codes for further data processing. Memory devices can be separated into volatile and non-volatile, where non-volatile memory devices can retain the data even if the power supply is turned off. Unlike non-volatile memory devices, volatile memory devices require power to maintain the stored information.

Flash memory is a non-volatile computer memory that can be electrically erased and reprogrammed. It is a technology that is primarily used in memory cards and USB flash drives, which are used for general storage and transfer of data between computers and other digital products. As electronic devices become smaller, the size of the flash memory cells shrinks as well. Today, in order to make electronic devices of small sizes, increasing the integration of elements is a major issue.

FIG. 1 shows a structure of a two-bit flash memory cell according to prior art. As shown in FIG. 1, the structure of the conventional two-bit flash memory cell comprises: a substrate 10, a gate insulating layer 12 comprising a silicon oxide layer 18, a silicon nitride layer 16, and a silicon oxide layer 14, wherein the silicon nitride layer 16 has two charge storage regions 16a, 16b and a control gate 20 positioned on the gate insulating layer 12.

The two charge storage regions 16a, 16b of the above-mentioned flash memory cell are capable of storing two-bit data. However, as the size of the electronic device shrinks, a short channel effect is formed because the gate channel length becomes shorter. Furthermore, the smaller the size, the more difficult it is to achieve alignment of elements. Therefore, a new structure of the memory cell and a new method of making the memory cell are needed to overcome the short channel effect and solve the problem of element alignment.

SUMMARY OF THE INVENTION

To solve the above-mentioned problem, a memory structure and a method of making the memory structure, such as embedding the floating gates into the opening of the substrate and covering the control gate on the floating gates are disclosed. The structure and the fabricating method disclosed in the present invention can reduce the difficulty of element alignment and decrease the short channel effect. In addition, the structure and the fabricating method disclosed in the present invention can be applied to many kinds of memory devices such as DRAM, SRAM, EPROM, or EEPROM.

According to the preferred embodiment of the present invention, a memory structure comprising: a substrate; a first trench positioned in the substrate; a second trench positioned in the substrate; a floating gate positioned between the first trench and the second trench; a control gate positioned on the surface of the substrate and covering the floating gate; a gate dielectric layer positioned between the control gate and the floating gate and between the control gate and the substrate; a tunnel dielectric layer positioned between the floating gate and the substrate; and a source and drain doping region positioned at a side of the floating gate.

According to another preferred embodiment of the present invention, a method for fabricating a memory structure, comprising: providing a substrate having a pad, forming an opening in the pad, forming a first spacer on a sidewall of the opening, filling the opening with a sacrificial layer which has a surface lower than a surface of the first spacer, removing the first spacer and exposing a portion of the substrate, partially removing the exposed portion of the substrate to define a first trench and a second trench, removing the sacrificial layer to expose a surface of the substrate to function as a channel region, forming a first dielectric layer on a surface of the first trench, a surface of the second trench and a surface of the channel region, filling the first trench and the second trench with a first conductive layer, forming a second dielectric layer on a surface of the first conductive layer and the surface of the channel region, filling the opening with a second conductive layer, and removing the pad.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
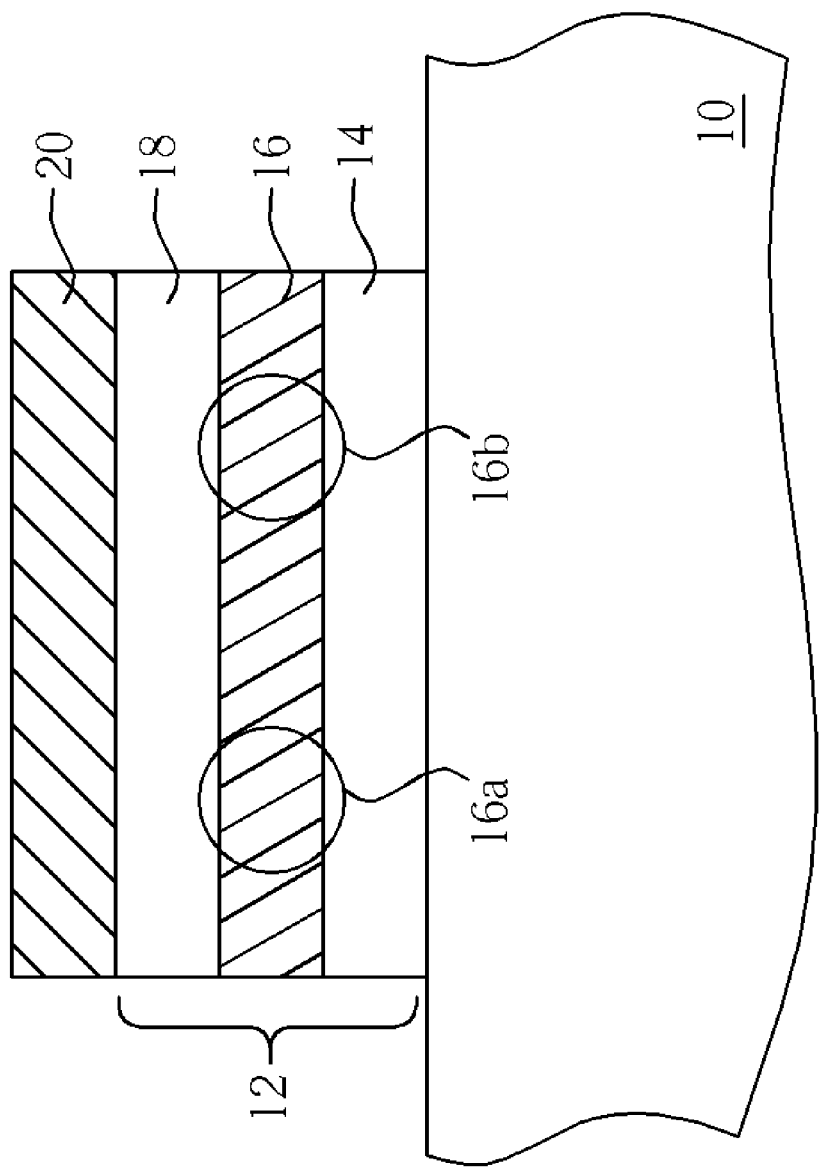
FIG. 1 shows a structure of a two-bit flash memory cell according to prior art.
Figure 2:
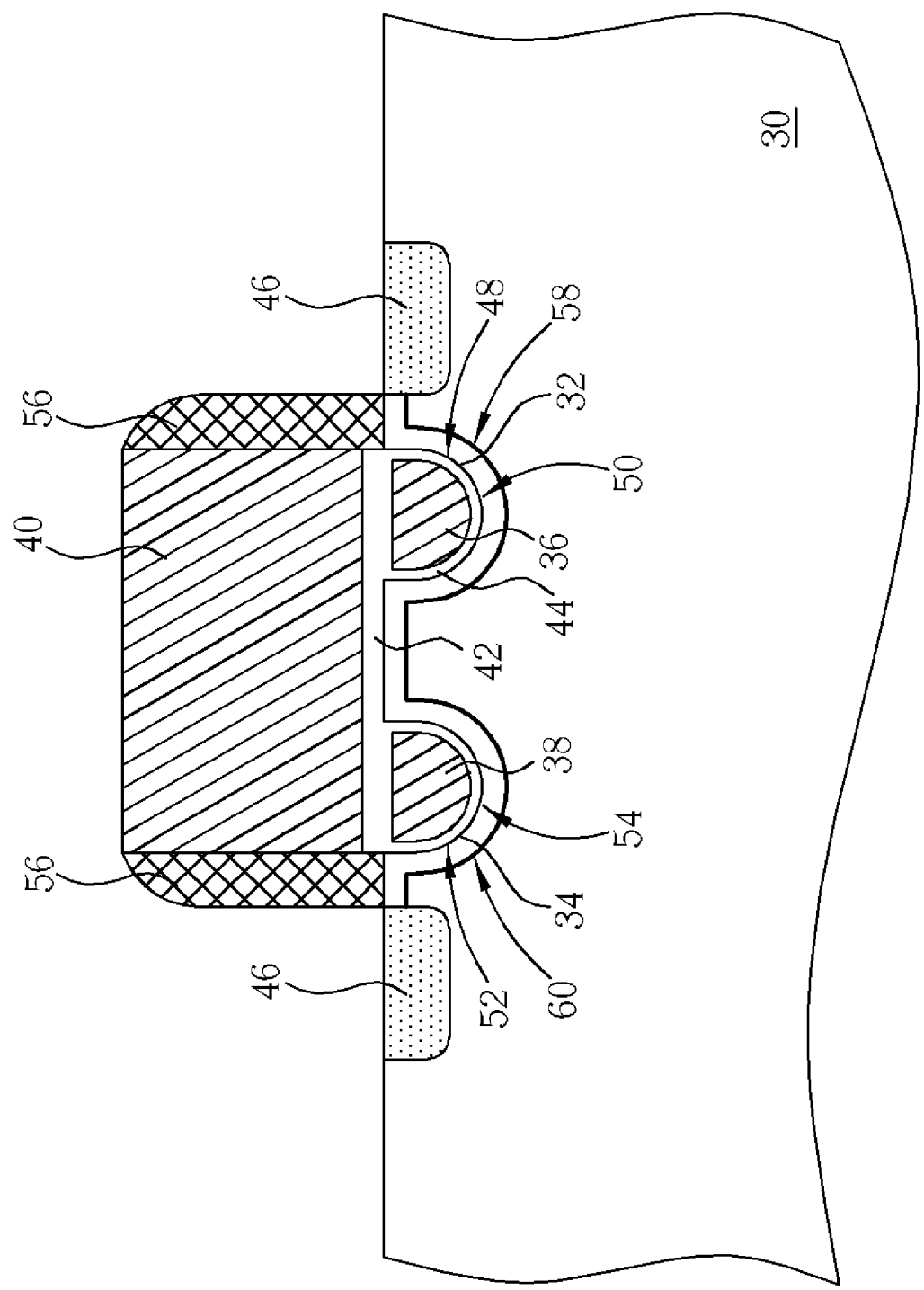
FIG. 2 depicts a sectional view of a flash memory structure according to the preferred embodiment of the present invention.

FIG. 2 depicts a sectional view of a flash memory structure according to the preferred embodiment of the present invention. The memory structure of the present invention includes: a substrate 30, a first trench 32 and a second trench 34 positioned in the substrate 30, wherein the first trench 32 comprises a first sidewall 48 and a first U-shaped bottom 50 and the second trench 34 comprises a second sidewall 52 and a second U-shaped bottom 54, floating gates 36, 38 positioned in the first trench 32 and the second trench 34, a first floating gate channel 58 surrounding the first U-shaped bottom 50, a second floating gate channel 60 surrounding the second U-shaped bottom 54, a control gate 40 positioned on the surface of the substrate 30 and covering floating gates 36,38, a gate dielectric layer 42 positioned between the control gate 40 and floating gates 36,38 and between the control gate 40 and the substrate 30, a tunnel dielectric layer 44 positioned between floating gates 36,38 and the substrate 30, and a source and drain doping region 46 positioned adjacent to the floating gates 36,38. In addition, the memory structure further comprises a spacer 56 positioned at two sides of the control gate 40, wherein the spacer 56 may comprise silicon nitride. It is noteworthy that the floating gate 36 is not connected with the floating gate 38.

The substrate 30 may be a semi-conductive material, such as Si, Ge, C—Si, silicon on insulator (SOI), Si—Ge on insulator, compound semiconductor, multilayer semiconductor or any combination thereof. Floating gates 36, 38 and the control gate 40 usually comprise polysilicon, wherein floating gates 36, 38 are for electron storage and the control gate 40 is for turning on or turning off the gate channel. Furthermore, the gate dielectric layer 42 and the tunnel dielectric layer 44 may be silicon oxide, silicon nitride, silicon oxide/silicon nitride, silicon nitride/silicon oxide, or silicon oxide/silicon nitride/silicon oxide.

FIG. 3 to FIG. 12 depict a method for fabricating a flash memory structure according to a preferred embodiment of the present invention.

Figure 3:
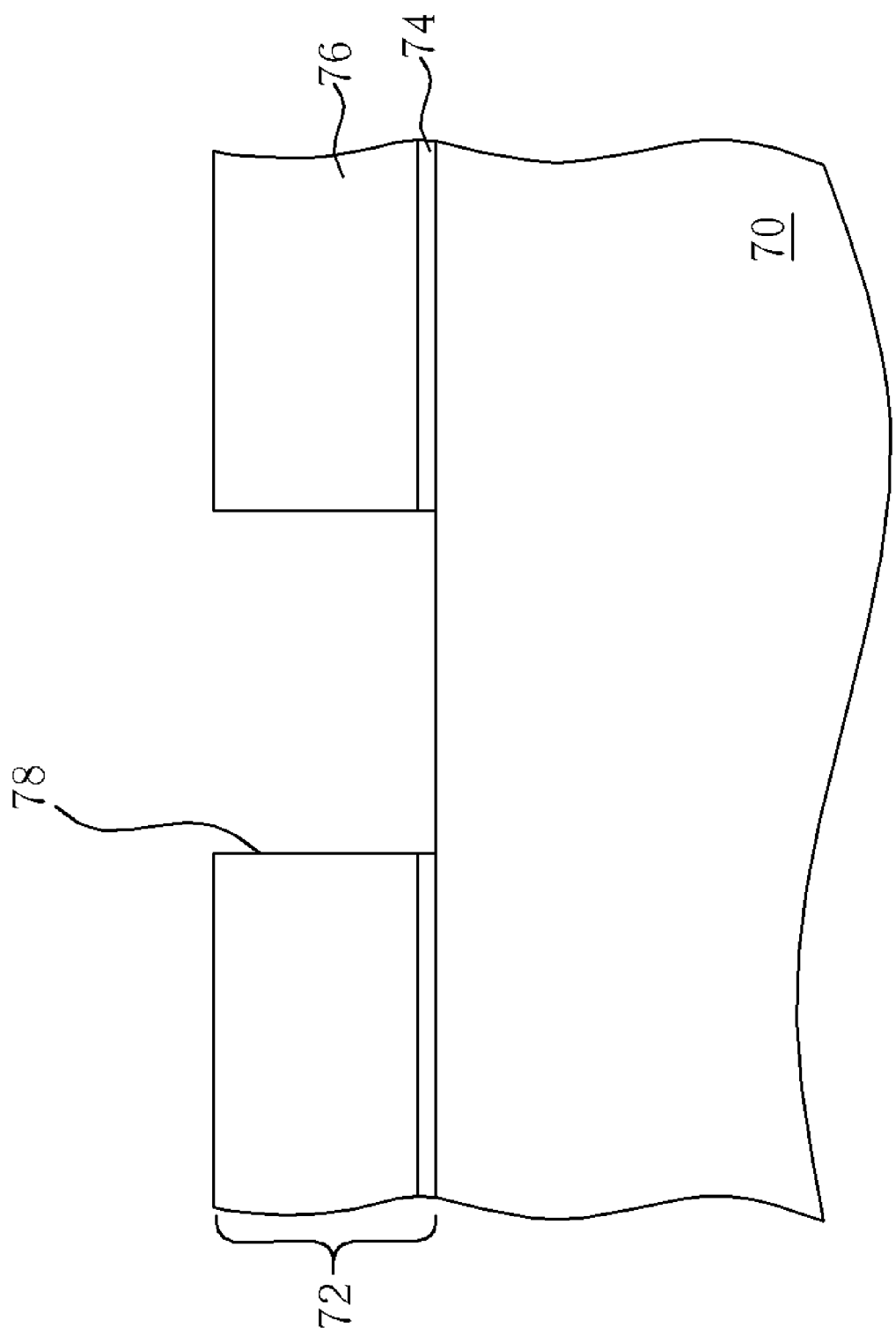
FIG. 3 to FIG. 12 depict a method for fabricating a flash memory structure according to a preferred embodiment of the present invention.

As shown in FIG. 3, a substrate 70 covered by a pad 72 is provided, wherein the pad 72 comprises a pad oxide layer 74 and a pad nitride layer 76. Next, an opening 78 is formed in the pad 72.

Figure 4:
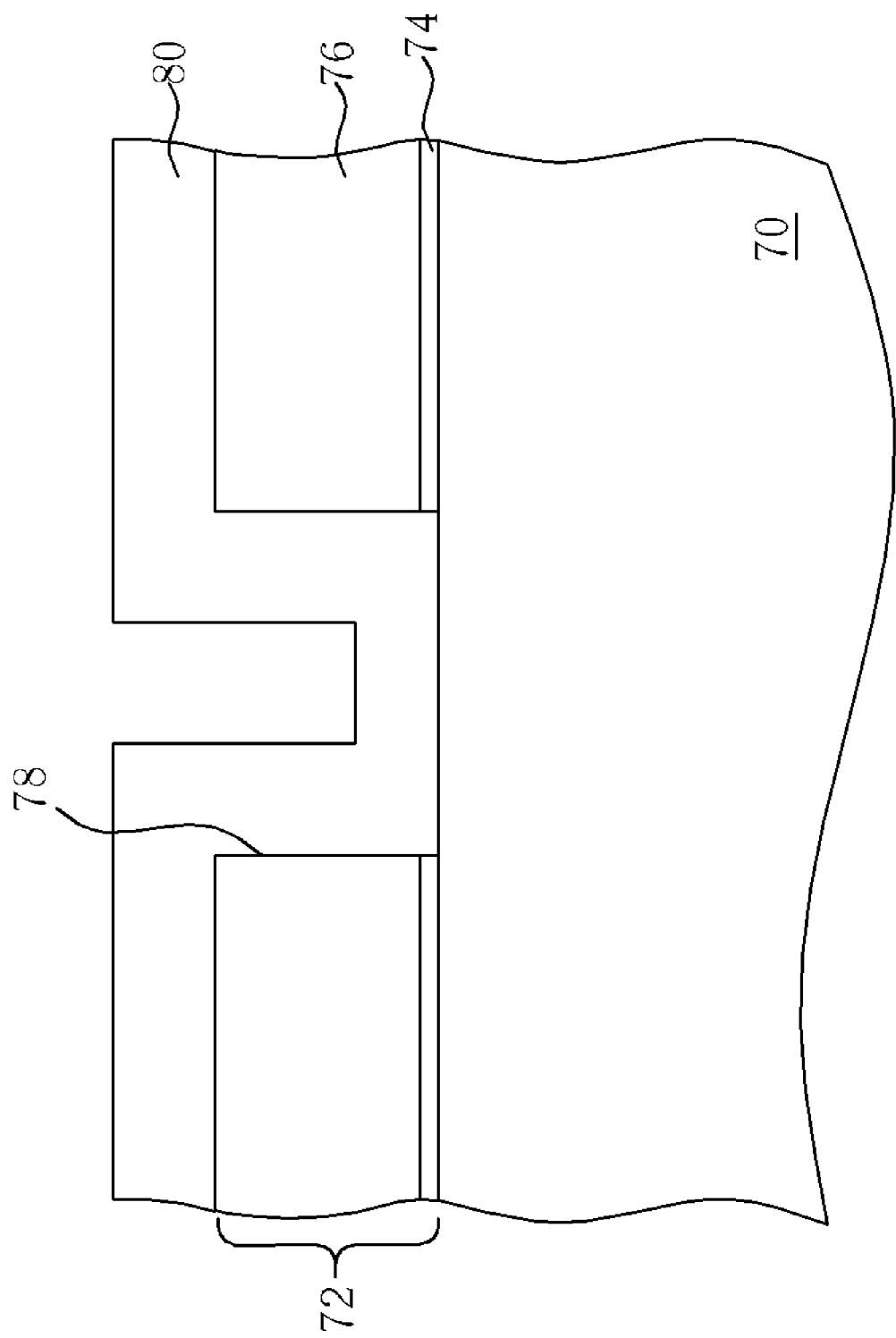

As shown in FIG. 4, an insulating layer 80 such as BSG is formed on the surface of the pad 72 and the opening 78.

Figure 5:
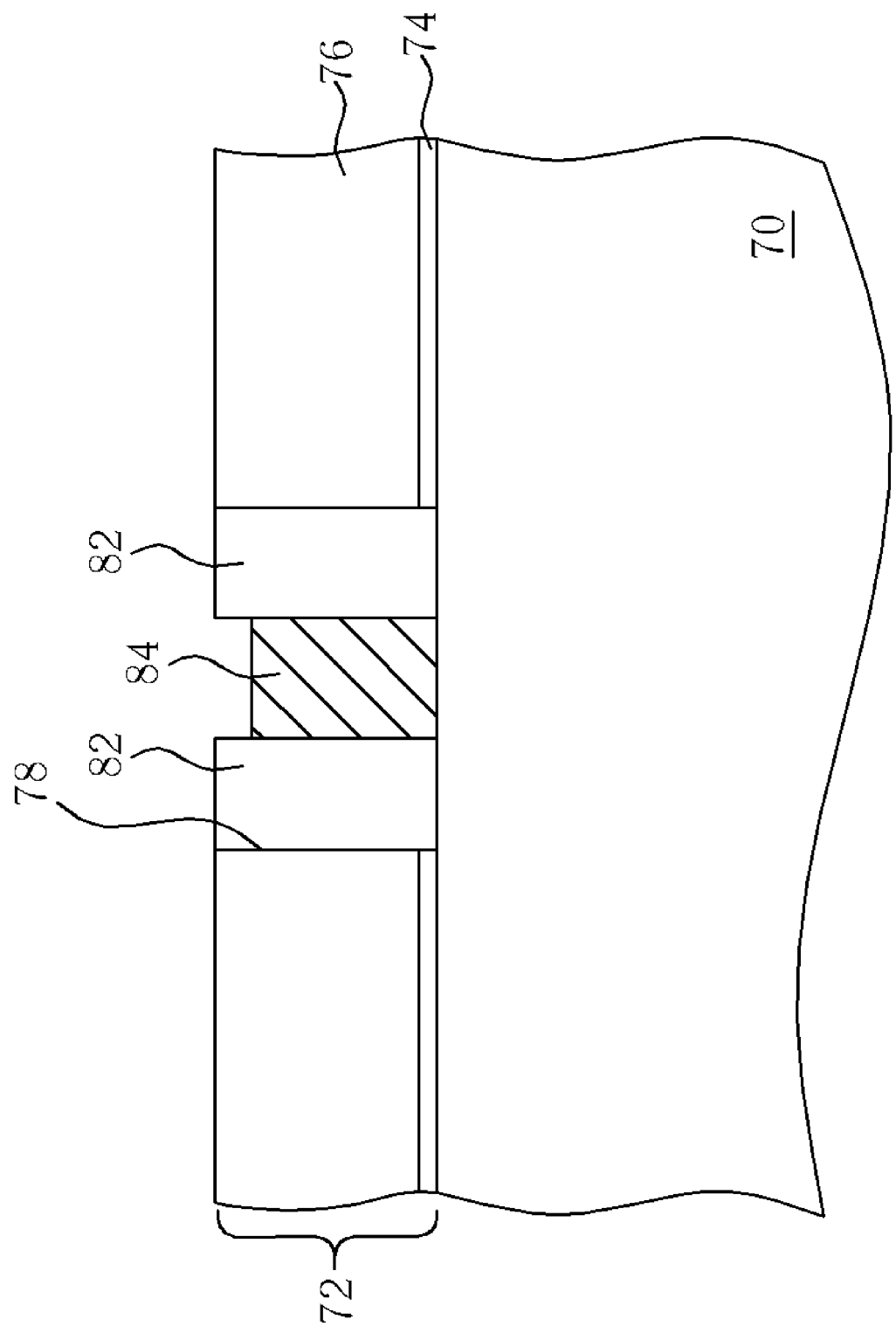

As shown in FIG. 5, the insulating layer 80 is removed by a dry etching process to form a first spacer 82 on the sidewall of the opening 78. Then, a sacrificial layer 84 such as photoresist fills up the opening 78. Next, the sacrificial layer 84 is removed by the dry etching process so that the surface of the sacrificial layer 84 is lower than the surface of the first spacer 82.

Figure 6:
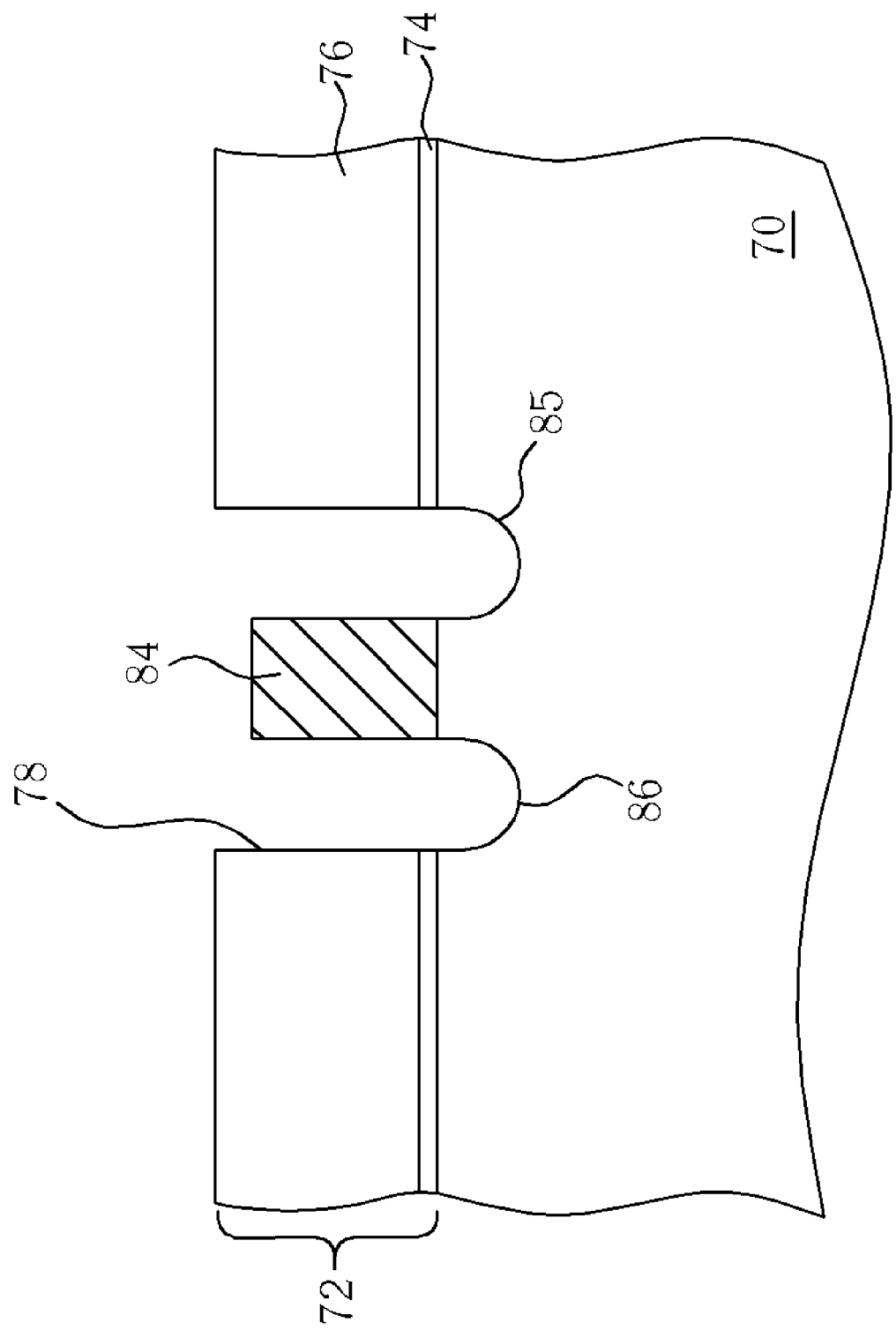

As shown in FIG. 6, the first spacer 82 is removed by the wet etching process, and the substrate 70 is partly exposed. Then, a dry etching process is performed on the substrate 70, and part of the substrate 70 is removed to define trenches 85, 86 by taking the sacrificial layer 84 and the pad 72 as a mask.

Figure 7:
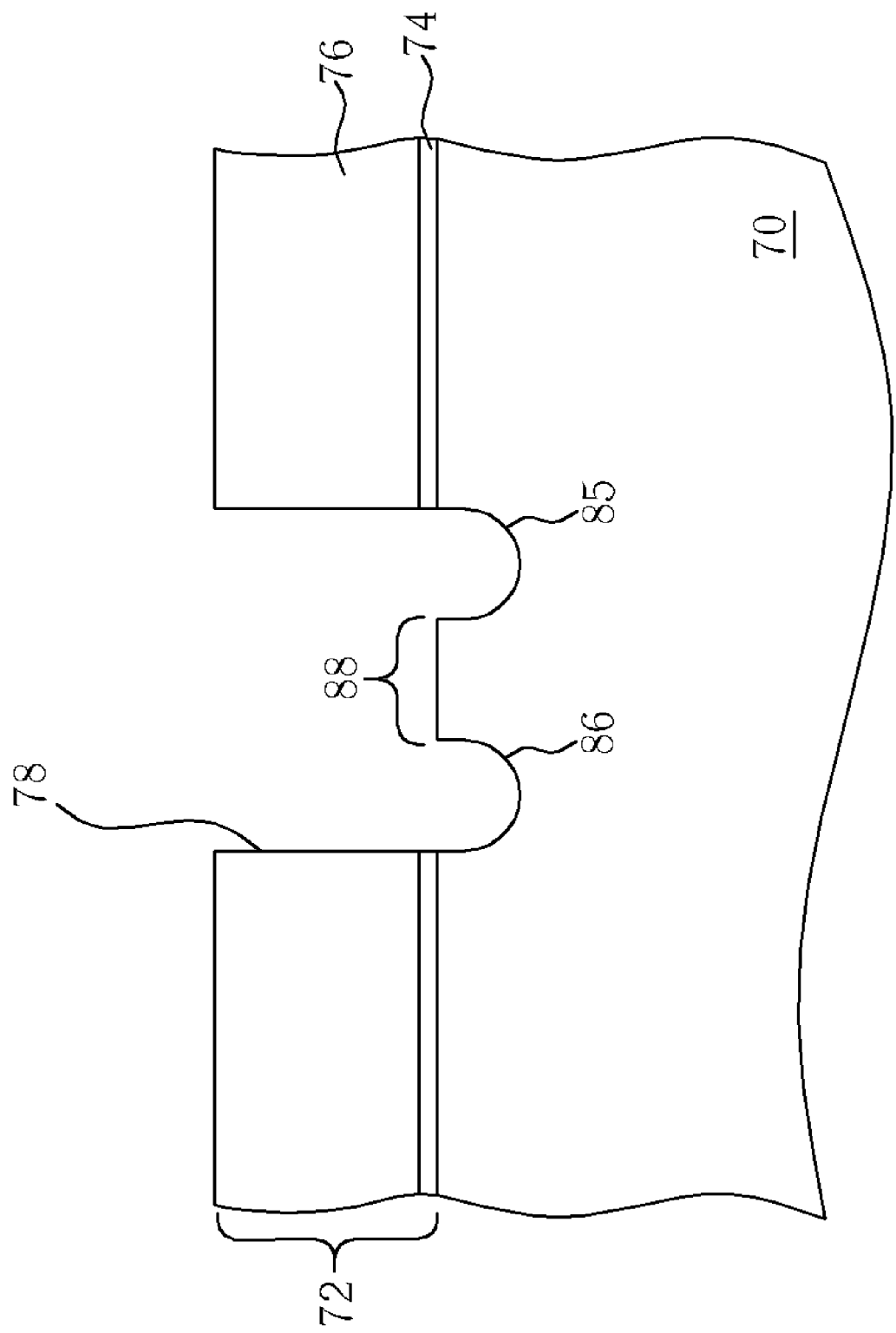

As shown in FIG. 7, according to the preferred embodiment of the present invention, the sacrificial layer 84 such as photoresist is removed by a conventional etching process, and a channel region 88 is exposed.

Figure 8:
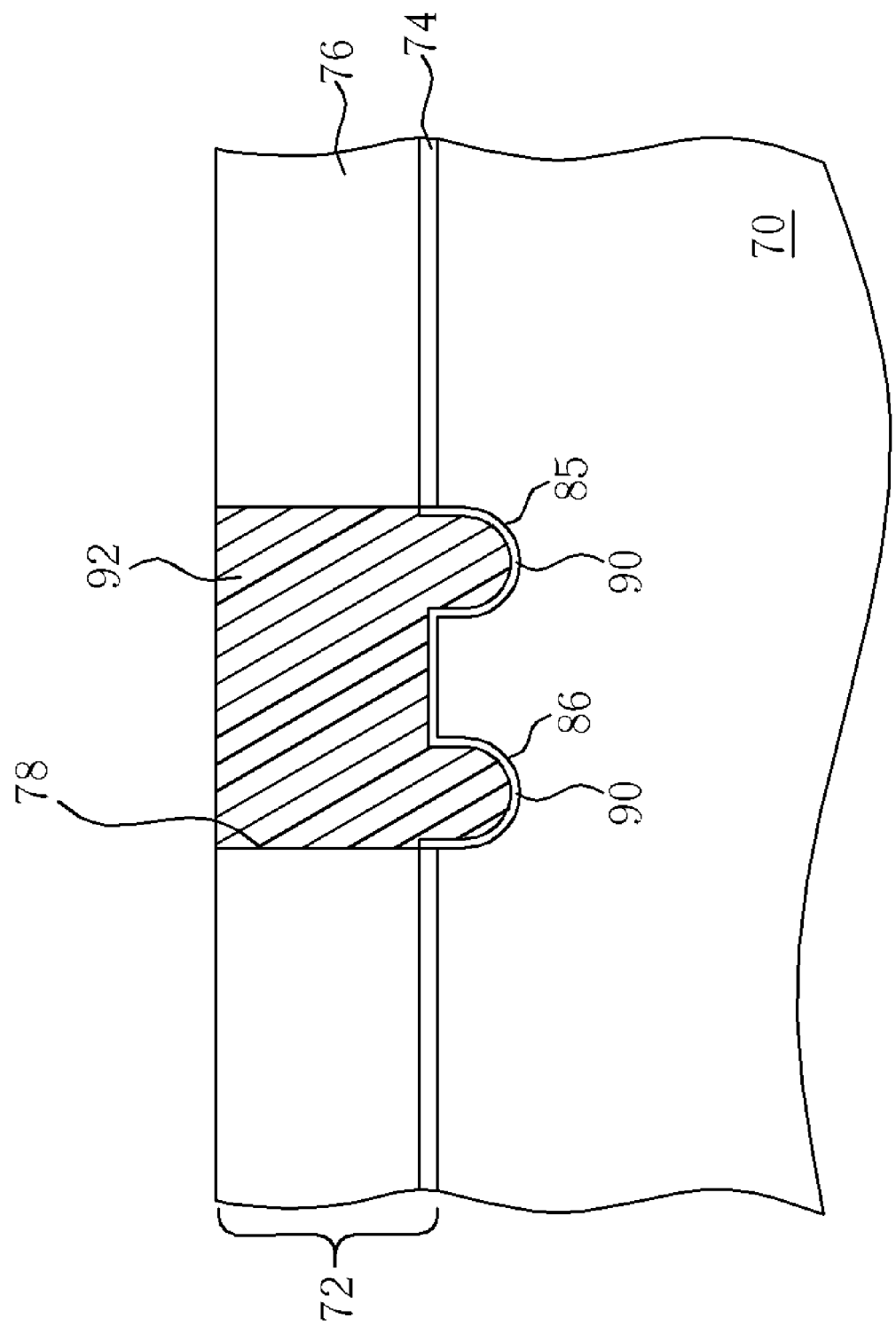

As shown in FIG. 8, a dielectric layer 90 serving as a tunneling dielectric layer is formed on the surface of trenches 85,86 and the channel region 88. In addition, the dielectric layer 90 may be silicon oxide, silicon nitride, silicon oxide/silicon nitride, silicon nitride/silicon oxide, or silicon oxide/silicon nitride/silicon oxide. The method of forming the dielectric layer 90 may comprise a thermal oxidation process and a chemical vapor deposition (CVD) process. For example, the dielectric layer 90 such as a silicon oxide layer may be formed by the thermal oxidation process. Next, a conductive layer 92 such as polysilicon formed by the CVD process fills up the opening 78 and trenches 85, 86.

Figure 9:
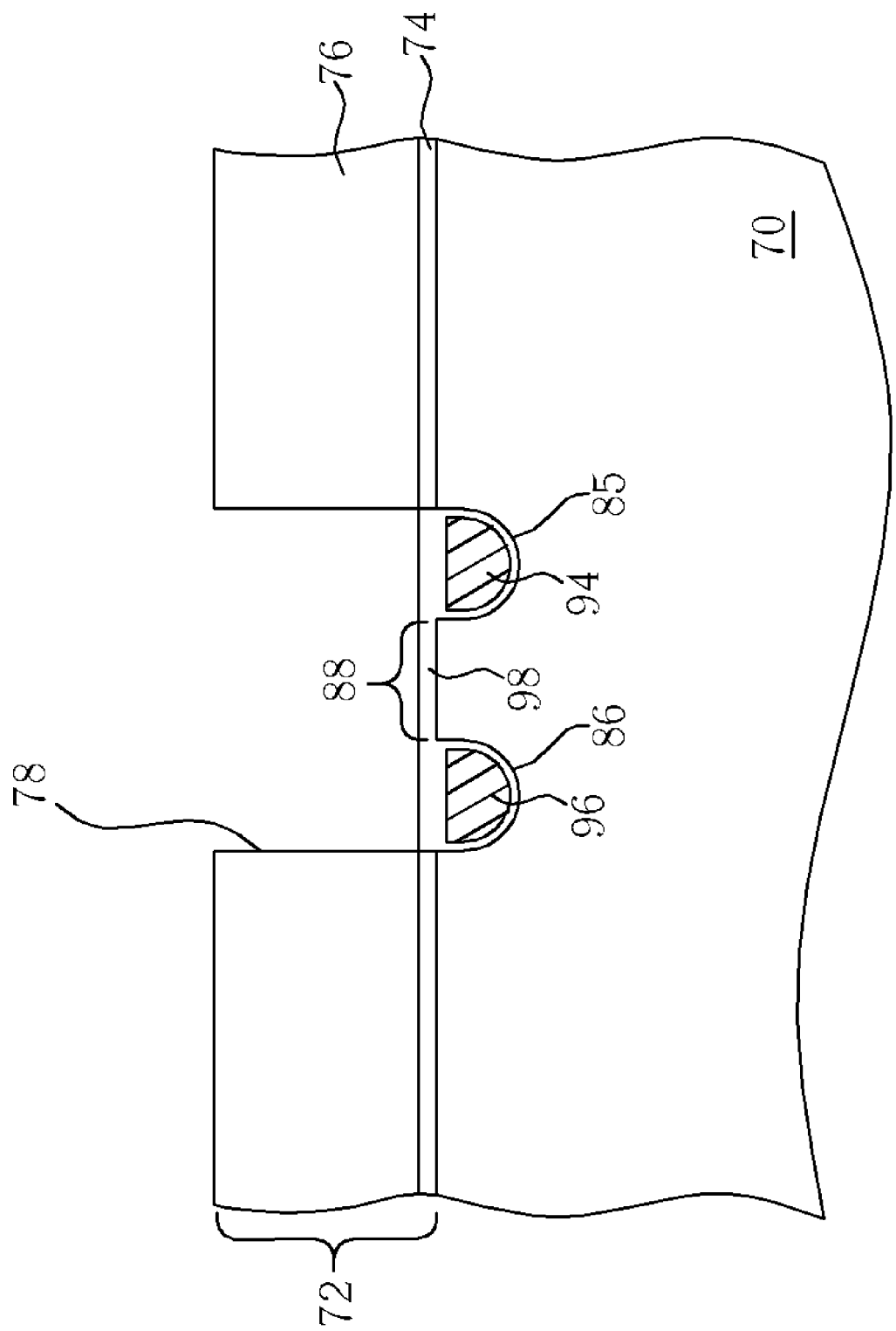

As shown in FIG. 9, part of the conductive layer 92 is removed by a chemical machine polish (CMP) process or a dry etching process to form floating gates 94,96 in the trenches 85,86 respectively. It is worthy of note that the floating gate 94 is not connected to the floating gate 96. In other words, the surface of the channel region 88 is not covered with the conductive layer 92. According to a preferred embodiment of the present invention, the surface of the conductive layer 92 is made to be lower than the surface of the channel region 88 by an over-etching process, and the floating gate 94 is not connect with the floating gate 96. Next, a dielectric layer 98 serving as a gate dielectric layer is formed on the surface of floating gates 94,96 and on the surface of the substrate 70 positioned between trenches 85, 86, that is to say, the dielectric layer 98 formed on the surface of channel region 88 and on the surface of floating gates 94,96 is taken as a gate dielectric layer. The dielectric layer 98 may be silicon oxide, silicon nitride, silicon oxide/silicon nitride, silicon nitride/silicon oxide, or silicon oxide/silicon nitride/silicon oxide. The method of forming the dielectric layer 98 may comprise a thermal oxidation process and a CVD process. For example, the dielectric layer 98 such as a silicon oxide layer may be formed by the thermal oxidation process.

Figure 10:
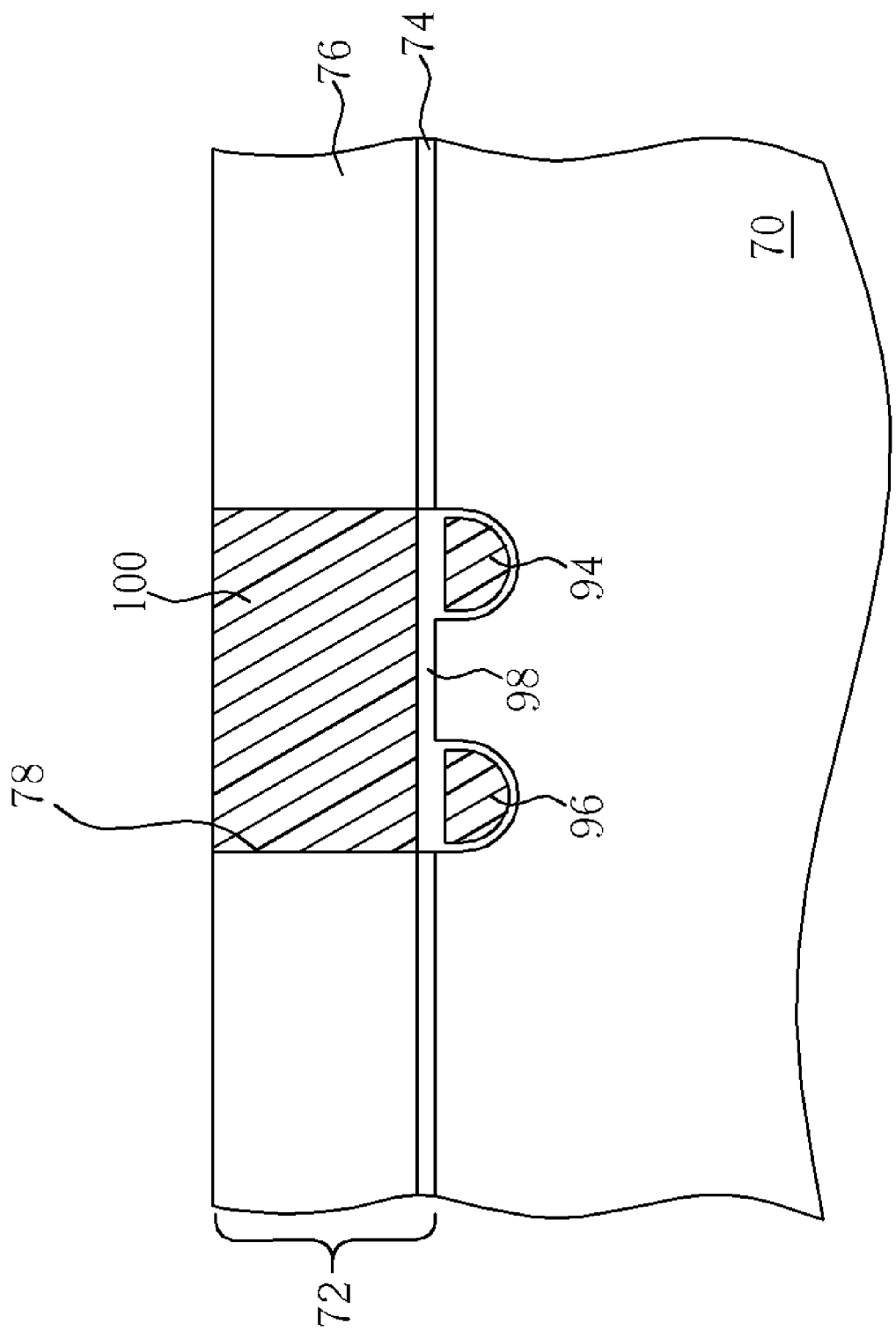

As shown in FIG. 10, the opening 78 is filled with a conductive layer 100. Then, the conductive layer 100 is aligned with the pad nitride layer 76 to form a control gate by the CMP process.

Figure 11:
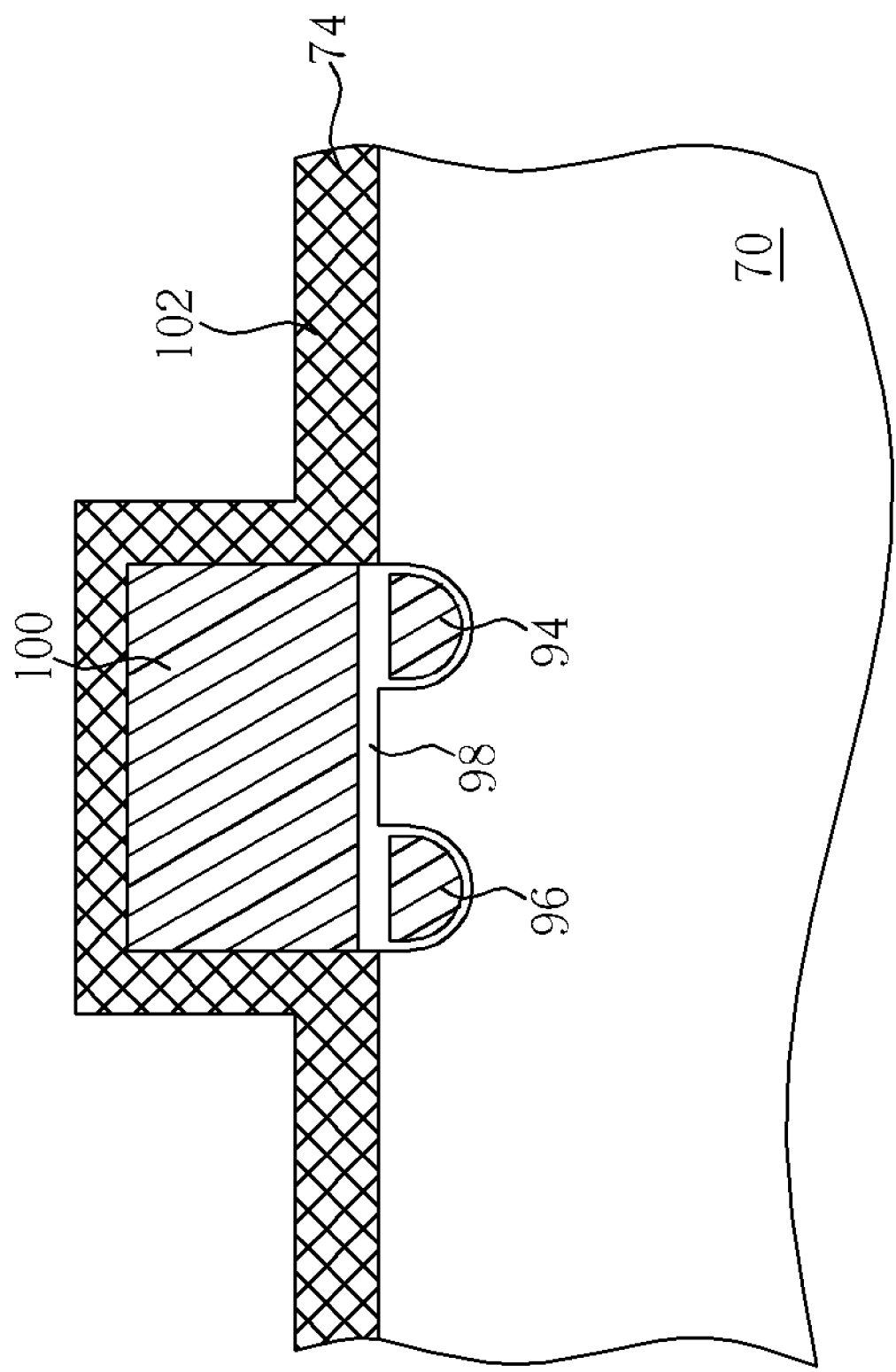

As shown in FIG. 11, the pad 72 is removed by a wet etching process. Then, an insulating layer 102 such as a silicon nitride layer is formed by a CVD process to cover the surface of the conductive layer 100 and the surface of the substrate 70.

Figure 12:
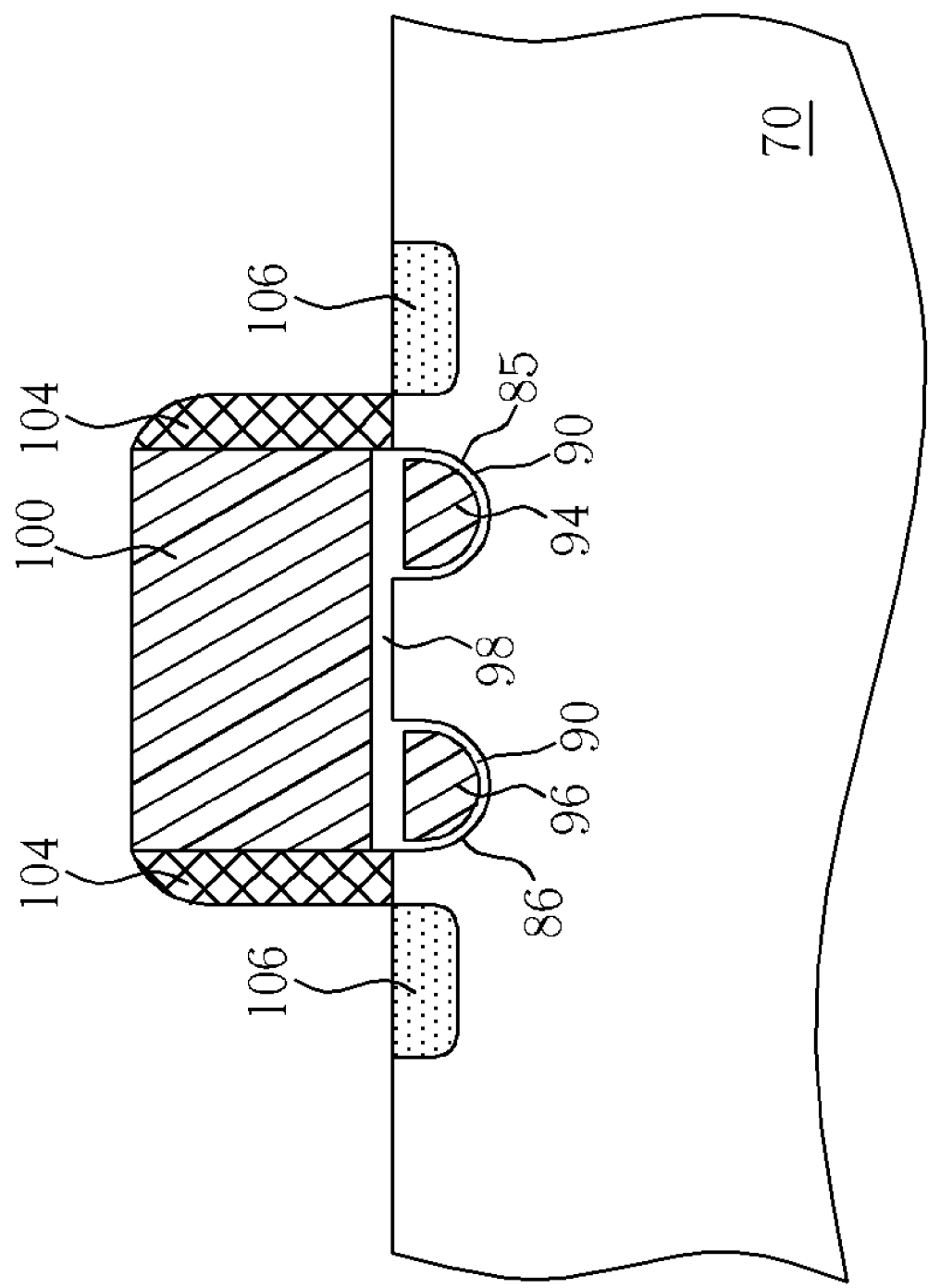

As shown in FIG. 12, the insulating layer 102 is removed by a dry etching process to form a second spacer 104 on two opposed sidewalls of the conductive layer 100. Then, a doping region 106 is formed in the substrate 70 adjacent to the spacer 104 as a source/drain region.

Those skilled in the art will readily observe that numerous modifications and alterations of the device and method may be made while retaining the teachings of the invention.

What is claimed is:

1. A memory structure comprising:
   a substrate having two floating gates formed inside the substrate and a tunnel dielectric layer formed between a bottom side of a respective one of the two floating gates and the substrate;
   a horizontal channel region spanning a space between the two floating gates;
   a control gate positioned on a surface of the substrate to sandwich a gate dielectric layer with the two floating gates; and
   a source and a drain doping region positioned adjacent to each of the two floating gates, wherein the source and drain doping regions are not positioned between the two floating gates.

2. The memory structure of claim 1, further comprising a spacer positioned at two sides of the control gate.

3. The memory structure of claim 1, wherein the memory structure further comprises a first trench for accommodating one of the two floating gates and wherein the first trench comprises a first sidewall and a first U-shaped bottom.

4. The memory structure of claim 3, wherein the memory structure further comprises a second trench for accommodating the other floating gate and wherein the second trench comprises a second sidewall and a second U-shaped bottom.

5. The memory structure of claim 3, further comprising a first floating gate channel surrounding the first U-shaped bottom.

6. The memory structure of claim 4, further comprising a second floating gate channel surrounding the second U-shaped bottom.

7. The memory structure of claim 1, wherein the material of the tunnel dielectric layer is selected from the group consisting of silicon oxide, silicon nitride, silicon oxide/silicon nitride, silicon nitride/silicon oxide, and silicon oxide/silicon nitride/silicon oxide.

* * * * *